United States Patent
Datta et al.

(10) Patent No.: US 9,646,666 B2
(45) Date of Patent: May 9, 2017

(54) VOLTAGE CONTROLLED SPIN SWITCHES FOR LOW POWER APPLICATIONS

(71) Applicant: GLOBALFOUNDRIES Singapore Pte. Ltd., Singapore (SG)

(72) Inventors: Deepanjan Datta, Singapore (SG); Vinayak Bharat Naik, Singapore (SG); Murali V R M Kota, Clifton Park, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/009,751

(22) Filed: Jan. 28, 2016

(65) Prior Publication Data

US 2016/0225890 A1 Aug. 4, 2016

Related U.S. Application Data

(60) Provisional application No. 62/110,603, filed on Feb. 2, 2015.

(51) Int. Cl.
*G11C 11/16* (2006.01)
*H01L 43/08* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC ........ H01L 29/78; H01L 43/02; G11C 11/161
See application file for complete search history.

(56) References Cited

U.S. PATENT DOCUMENTS 7,283,382 B2 * 10/2007 Windlass ............... G11C 11/22
  365/117
7,397,071 B2 * 7/2008 Sugahara ............... B82Y 10/00
  257/197

(Continued)

OTHER PUBLICATIONS

W. Echtenkamp and CH. Binek, Electric Control of Exchange Bias Training, Physical Review Letters, Oct. 31, 2013, pp. 187204-1-187204-5, 111-18, American Physical Society, Nebraska, USA.

(Continued)

*Primary Examiner* — William Coleman
(74) *Attorney, Agent, or Firm* — Horizon IP Pte. Ltd.

(57) ABSTRACT

Spin switch devices with voltage controlled magnetism in ultra-low power usage applications are disclosed. The spin switch devices may be configured to provide ultra-low power and ultra-high speed switching by directly controlling drain or gate electron spins via electric field induced magnetic anisotropy tuned with finite gate voltage. A lateral spin switch with voltage controlled magnetic drain is placed in an "OFF" or an "ON" state by controlling the gate voltage to be equal to 0 or greater than 0 volts respectively. A vertical spin switch with voltage controlled magnetic gate is placed in an "OFF" or an "ON" state by controlling a value of the gate voltage to be less than a threshold voltage or greater than the threshold voltage respectively. A voltage controlled complementary switch provides a very large gain by controlling a value of the gate voltage to be equal to 0 volts.

24 Claims, 13 Drawing Sheets

(51) Int. Cl.
*H01L 29/84* (2006.01)
*H01L 41/09* (2006.01)

(52) U.S. Cl.
CPC .......... *H01L 29/84* (2013.01); *H01L 41/0986* (2013.01); *H01L 43/08* (2013.01)

(56) References Cited

U.S. PATENT DOCUMENTS

| | | | | |
|---|---|---|---|---|
| 7,602,636 | B2 * | 10/2009 | Saito | B82Y 25/00 257/295 |
| 7,994,555 | B2 * | 8/2011 | Koo | G11C 11/16 257/295 |
| 8,138,758 | B2 * | 3/2012 | Wunderlich | G11C 11/16 257/421 |
| 8,737,122 | B2 * | 5/2014 | Saida | G11C 11/16 365/148 |
| 8,779,496 | B2 * | 7/2014 | Saito | B82Y 10/00 257/213 |
| 2009/0184930 | A1 * | 7/2009 | Li et al. | G06F 3/0412 345/173 |
| 2015/0325278 | A1 * | 11/2015 | Bauer | H01L 43/08 365/158 |

OTHER PUBLICATIONS

K. D. Belashchenko, Equilibrium Magnetization at the Boundary of a Magnetoelectric Antiferromagnet, Physical Review Letters, Oct. 1, 2010, pp. 147204-1-147204-4, 105-14, The American Physical Society, Nebraska, USA.

A.F. Andreev, Macroscopic Magnetic Fields of Antiferromagnets, JETP Lett., May 10, 1996, pp. 758-759, 63-9, American Institute of Physics, Moscow, Russia.

Uwe Bauer et al., Magneto-Ionic Control of Interfacial Magnetism, Nature Materials Letters, Feb. 2015, pp. 174-181, 14, Macmillan Publishers Limited.

Behtash Behin-Aein et al., Proposal for an All-Spin Logic Device with Built-in Memory, Nature Nanotechnology Letters, Apr. 2010, pp. 266-270, 5, Macmillan Publishers Limited.

Xi He et al., Robust Isothermal Electric Control of Exchange Bias at Room Temperature, Nature Materials Articles, Jul. 2010, pp. 579-585, 9, Nature Materials.

Behtash Behin-Aein et al., Switching Energy-Delay of All Spin Logic Devices, Applied Physics Letters, downloaded Aug. 6, 2015, 98-12, AIP Publishing, American Institute of Physics.

* cited by examiner

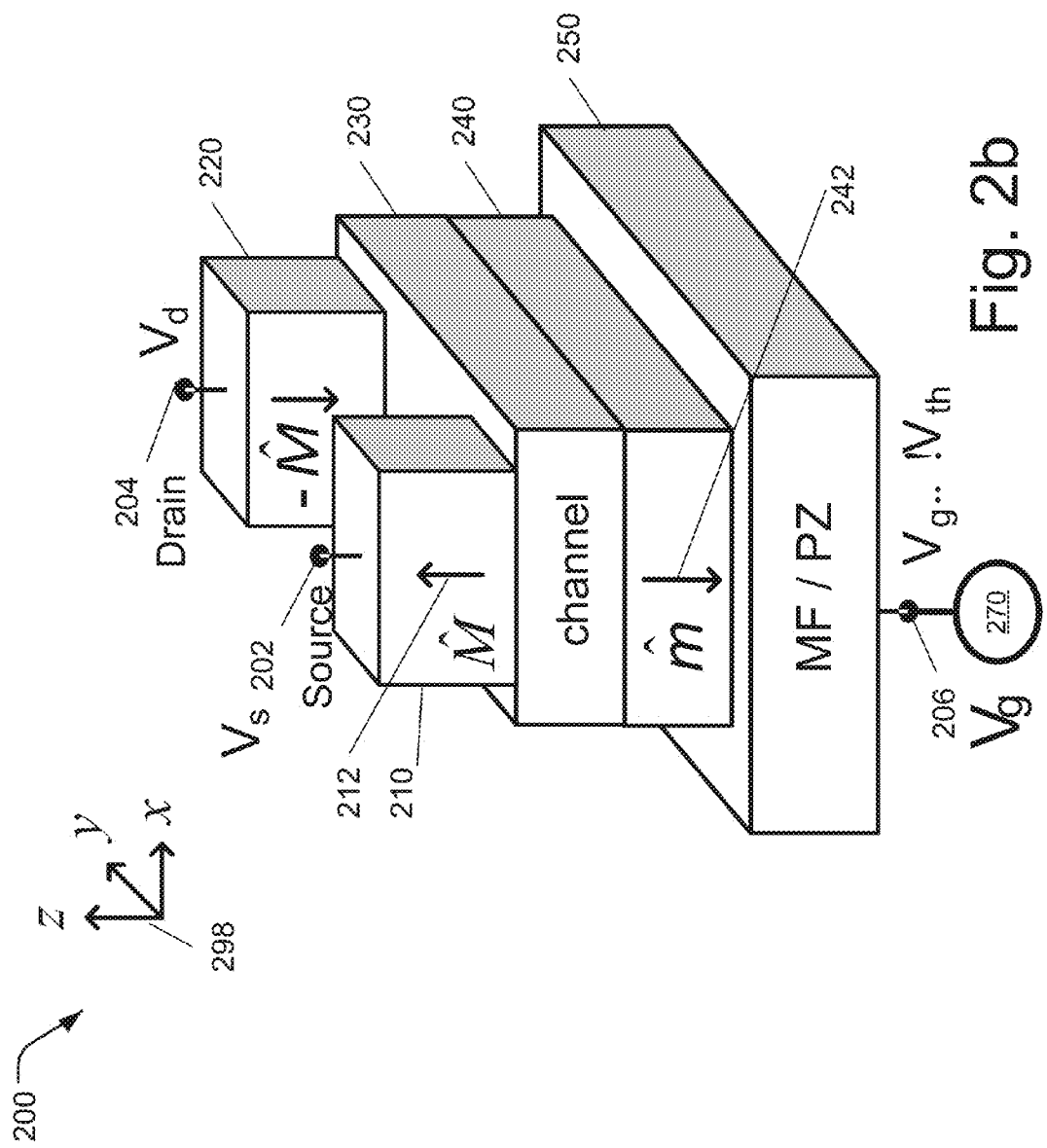

VOLTAGE CONTROLLED SPIN SWITCHES FOR LOW POWER APPLICATIONS

CROSS-REFERENCE TO RELATED APPLICATION

This application claims the benefit of and priority to U.S. Provisional Patent Application No. 62/110,603, filed Feb. 2, 2015, which is hereby incorporated by reference in its entirety.

BACKGROUND

Switches are commonly used as one of the components of circuit design. Switches found in most of the electronic devices are generally charge based switches, such as a complementary metal oxide semiconductor (CMOS) switches. However, power consumption and scalability in such charge based switches remains a concern.

Advances in the field of spin-transport and magnetism have contributed to the development of spintronic devices including spin transfer torque random access memory (STT-MRAM) cells and spintronic logic devices. Spintronic logic devices may serve as potential candidate to replace CMOS switches. Nevertheless, most of the spintronic switches may require higher currents for writing and deliver lower performance such as slower switching speeds. This may result in higher power consumption and poor performance for many high-speed memory and logic applications.

From the foregoing discussion, it is desirable to provide ultra-low power and high speed spin devices, to be used as the main core of computation.

SUMMARY

Embodiments in the present disclosure relate to magnetic devices, in particular electric field controlled spintronic switch devices that include a reference ferromagnetic (FM) layer, and free ferromagnetic (FM) and/or, Magnetoelastic (ME) material on the top of a Multiferroic (MF) and/or, Piezoelectric (PZ) material. Technological appeal of MF or, PZ material is the ability to control magnetism with electric (E) field at room temperature. Because of the coupled antiferromagnetism (AFM) and ferroelectricity (FE) induced in MF, by modulating FE polarization. A simultaneous change occur in AFM spins at the interface, that allows control of interfacial magnetic anisotropy energy (i-MAE) resulting in the switching of the direction of magnetism of the FM layer. A similar electric field control can be achieved by PZ/ME combination resulting in switching of the state of magnetism of ME layer. The above phenomena enable virtually dissipation-less information writing in non-volatile memory and logic devices. The E-field controlled spin switch devices may be configured to provide ultra-low power and ultra-high speed switching by directly controlling magnetic spins of drain or, gate ferromagnets by modulating the interfacial magnetic anisotropy tuned via finite voltage.

In one embodiment, a lateral spin switch is configured to include at least three electrodes i.e. source, drain, and gate respectively. The lateral spin switch includes a source ferromagnet (FM) layer having a magnetization vector along $\hat{M}$, the source FM being coupled to the source electrode; a drain ferromagnet (FM) or, Magnetoelastic (ME) layer having a magnetization vector $\hat{m}$, the drain magnet being coupled to the drain electrode, a channel disposed between the source magnet and the drain magnet and a gate disposed above the drain magnet, the gate being coupled to the gate electrode. The orientation of the drain magnetization vector $\hat{m}$ is directly controlled by a voltage source $V_g$ coupled to the gate electrode, thereby changing the angle formed between the source magnetization vector $\hat{M}$ and the drain magnetization vector $\hat{m}$. The proposed lateral spin switch with voltage controlled magnetic drain works in an "OFF" or, an "ON" state just by controlling the gate voltage to be equal to 0 or greater than 0 volts respectively. A voltage controlled complementary switch provides a very large gain by controlling a value of the gate voltage to be equal to 0 volts.

In another embodiment, a vertical spin switch with voltage controlled magnetic gate is placed in an off or an on state by controlling the magnitude of the gate voltage to be less than a threshold voltage $V_{th}$ or greater than the threshold voltage $V_{th}$ respectively. The vertical spin switch is configured to include at least three electrodes including source, drain, and gate respectively. The vertical spin switch also includes a source ferromagnet (FM) having a perpendicular magnetization vector $\hat{M}$, the source FM being coupled to the source electrode; a drain ferromagnet (FM) having a perpendicular magnetization vector $-\hat{M}$, the drain FM being coupled to the drain electrode, and a channel layer disposed between the source FM and the drain FM. The bottom surfaces of the drain FM and the source FM are coplanar with a top surface of the channel layer. The vertical spin switch also includes a gate ferromagnet (FM) or, Magnetoelastic (ME) layer with a floating magnetization vector along $\hat{m}$, the gate magnet free layer being disposed below the channel layer and an exchange coupled Multiferroic (MF) or, Piezoelectric (PZ) layer disposed below the gate magnet free layer. The multiferroic or, piezoelectric layer is coupled to a gate electrode. The orientation of the gate magnetization vector $\hat{m}$ is directly controlled by a finite voltage source $V_g$ coupled to the gate electrode, thereby changing the angle formed between the magnetization vectors $\hat{M}$ and $\hat{m}$, similar to the lateral spin switch described in the previous section.

In yet another embodiment, a voltage controlled spin switch is configured to include a "Write" unit and a "Read" unit. The "Write" unit includes a voltage controlled multiferroic (MF) material or, a piezoelectric (PZ) material layer coupled to a gate electrode and a first floating ferromagnetic ($FM_1$) or, Magneto-elastic (ME) layer having a magnetization vector $\hat{m}$, where the $FM_1$/ME layer is disposed on top of the voltage controlled multiferroic (MF) material layer. The "Read" unit includes a first reference FM layer having a magnetization vector $\hat{M}$ and a second reference FM layer having a magnetization vector $-\hat{M}$, a common second floating ferromagnetic layer ($FM_2$) having a magnetization vector $-\hat{m}$, separated by an insulating layer. The $FM_1$ and $FM_2$ layers are separated by a configurable distance to enable magnetic coupling between themselves. The magnetization vector $\hat{m}$ is controlled by a voltage source $V_g$ coupled to the gate electrode. An angle formed between the magnetization vector $\hat{M}$ of reference FM layer and the magnetization vector $-\hat{m}$ of $FM_2$ layer is driven by a finite voltage $V_g$ applied across the gate electrode.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 2b shows an isometric view of an embodiment of a structure of a vertical spin switch, described with reference to FIG. 2a, operating in an off state.

FIG. 3b shows an isometric view of an embodiment of a structure of a "Write" unit of a lateral spin switch described with reference to FIG. 3a.

FIG. 3c shows an isometric view of an embodiment of a structure of a "Read" unit of a lateral spin switch described with reference to FIG. 3a.

DETAILED DESCRIPTION

Embodiments of the present disclosure generally relate to spin switch devices. In all of the embodiments, the spin switch devices are voltage controlled spin switch devices. The spin switch devices use the property of interface magnetocrystalline anisotropy at the Multiferroic (or, piezoelectric)/Ferromagnetic (or, magneto-elastic) interface. Surface magnetic moment of the ferromagnet can be controlled either by supplying or by depleting carriers from the interface, thereby controlling by applied electric field. The spin switch devices may be configured to provide ultra-low power switching by directly controlling the spin-polarized carriers in the drain or gate by introducing electric field controlled strain at the Multiferroic (MF)/Ferromagnet (FM) or, Piezoelectric (PZ)/magnetoelastic (ME) interface, thereby changing the interfacial magnetic anisotropy tuned via finite gate voltage. The spin switch devices can be incorporated into or used with, for example, electronic products such as mobile phones, smart card, mass storage, enterprise storage and industrial and automotive products as well as Internet of Things (TOT) based applications.

Figure 1A:
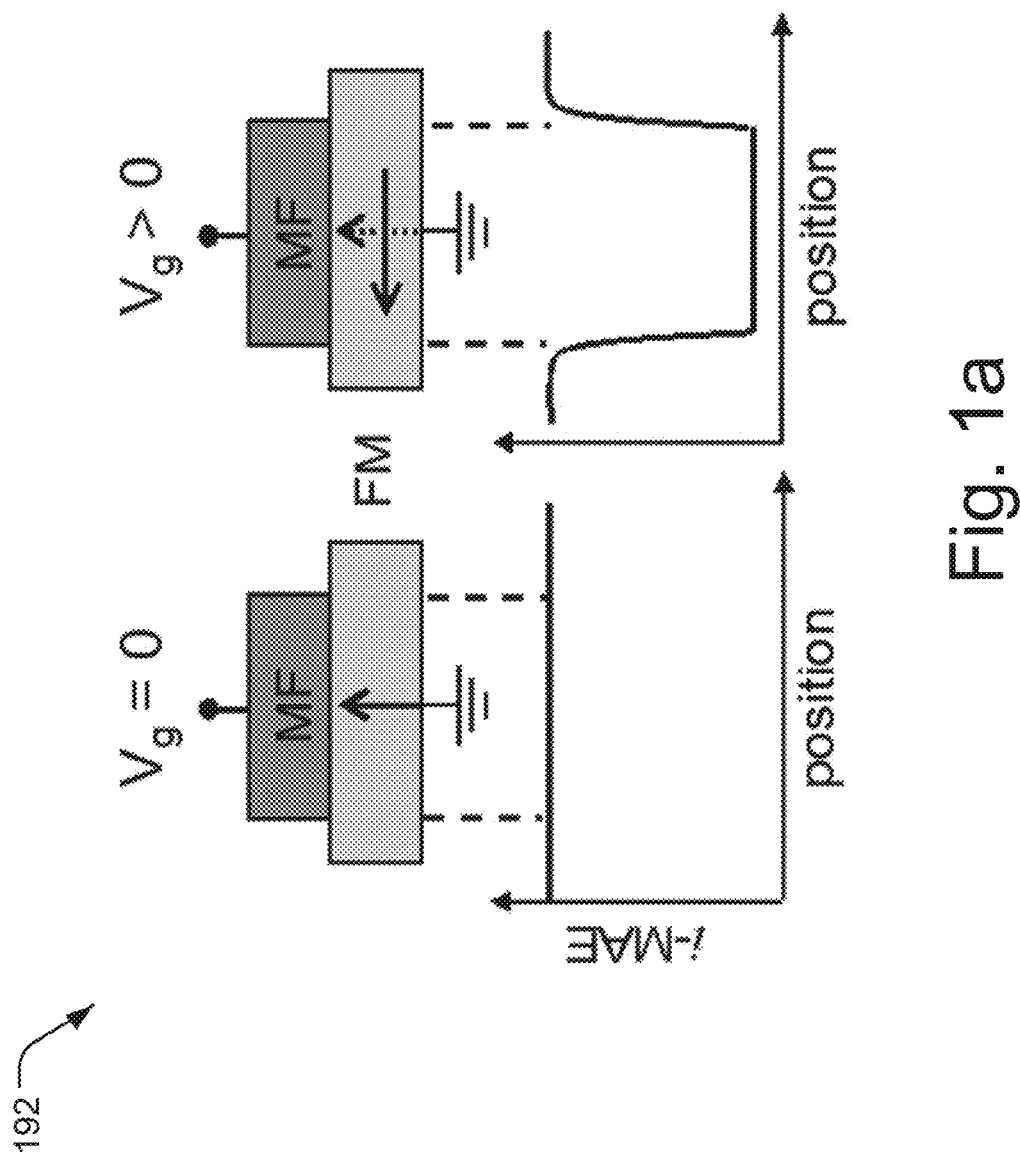
FIG. 1a illustrates a voltage controlled magnetic spin switching device.

FIG. 1a illustrates a voltage controlled or electric field controlled magnetic spin switching device 192. The electric field controlled spintronic switch device includes a fixed layer and a free ferromagnetic (FM) and/or, Magnetoelastic (ME) material on the top of a Multiferroic (MF) and/or, Piezoelectric (PZ) material.

Technological appeal of MF or PZ material is the ability to control magnetism with electric (E) field at room temperature. Due to the coupled antiferromagnetism (AFM) and ferroelectricity (FE) induced in MF, by modulating FE polarization, a simultaneous change occurs in AFM spins at the interface, that allows control of interfacial magnetic anisotropy energy (i-MAE) resulting in the switching of the magnetization of the FM layer. A similar E-field control can be achieved by PZ/ME material resulting in switching of state of magnetism of ME layer. The above phenomena enable virtually dissipation-less information writing in non-volatile memory. The spin switch devices may be configured to provide ultra-low power and ultra-high speed switching by directly controlling magnetic spins of drain or, gate ferromagnets via electric field induced interfacial magnetic anisotropy tuned via finite voltage Vg as shown below.

The schematic of the voltage controlled magnetic spin switching device 192 shows a change in interfacial magnetic anisotropy of a Multiferroic (MF)/Ferromagnet (FM) interface on application of a finite bias Vg in the MF material.

Figure 1B:
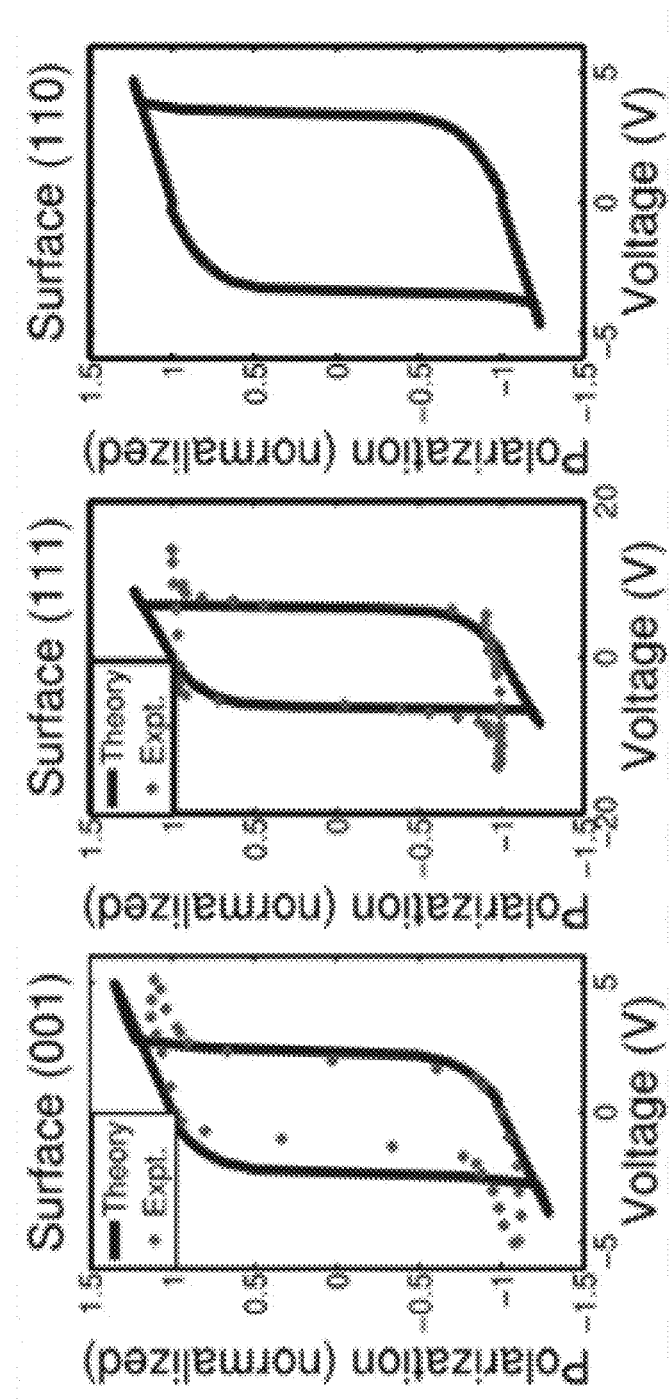
FIG. 1b is a graph illustrating change in normalized polarization of FM/MF material interface on application of external voltage.

FIG. 1b illustrates a graph 194 illustrating change in normalized polarization of a FM (CoFe)/MF (BFO) material interface on application of an external voltage. The graph 194 shows how magnetic polarization changes with voltage and is not restricted to the materials referenced above.

Below is a comparison of the energy dissipation for three different mechanisms of switching the magnetic polarization: (a) conventional STT device (3000 µJ/cm$^2$), (b) FM/MF (example CoFe/BFO: 60 µJ/cm$^2$), and (c) ME/PZ (example Terfenol-D/PMN-PT 2.5 µJ/cm$^2$).

Figure 1C:
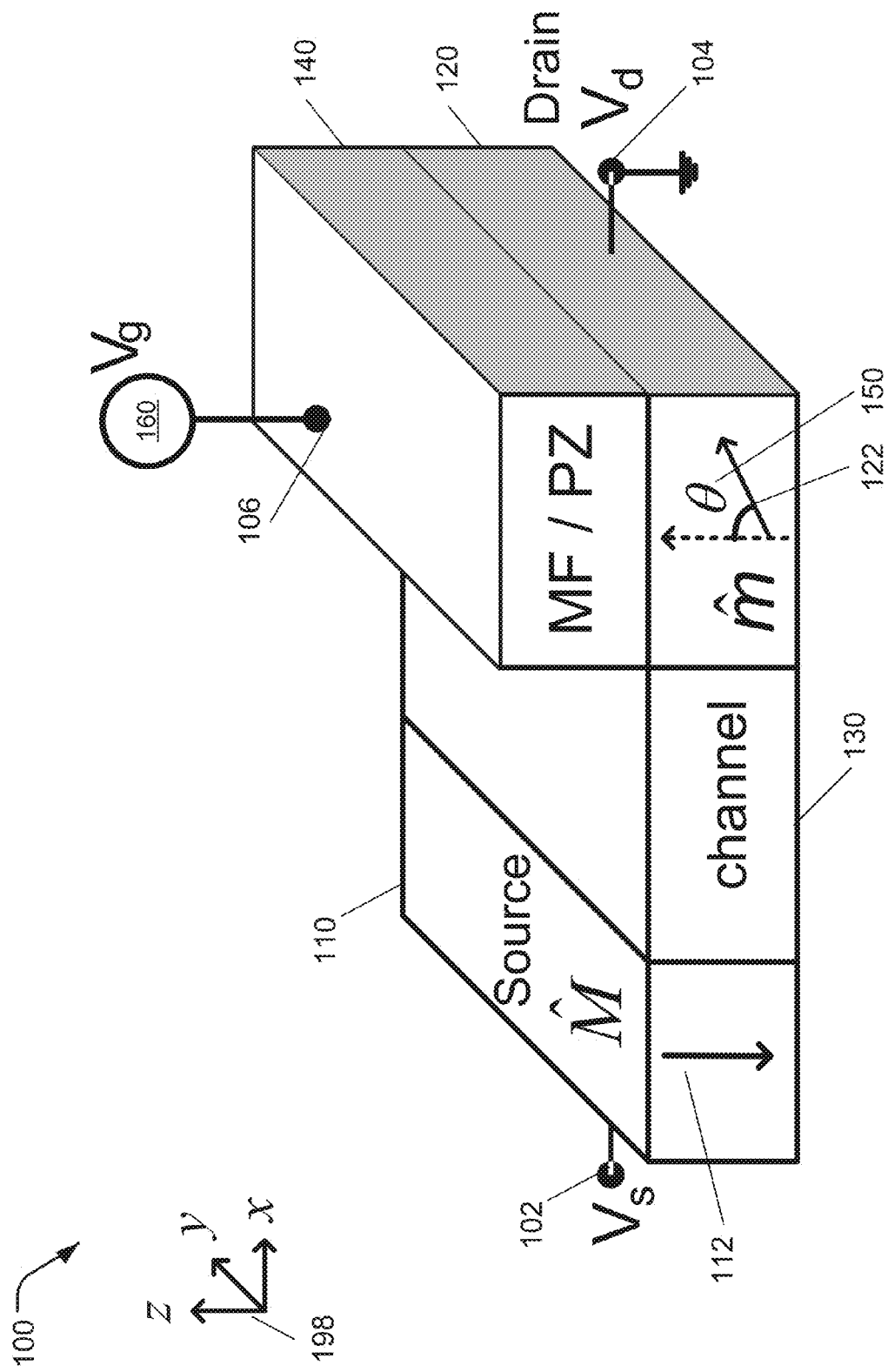
FIG. 1c shows an isometric view of an embodiment of a structure of a lateral spin switch with voltage controlled magnetic drain.

FIG. 1c shows an isometric view of an embodiment of a structure of a lateral spin switch 100 with voltage controlled magnetic drain. The lateral switch 100 includes at least three electrodes including source 102, drain 104, and gate 106 electrodes. A XYZ coordinate system 198 may be used as a reference to illustrate magnetization vector direction and 3D structural aspects of the lateral switch 100. A source magnet 110 having a magnetization vector $\hat{M}$ 112 is coupled to the source electrode 102. In the depicted embodiment, the source magnet 110 is fixed and has the magnetization vector $\hat{M}$ 112 that may be configured to be aligned with +/−z axis (e.g., perpendicular to the "easy plane" of the magnets). Other suitable orientations of the magnetization vector $\hat{M}$ 112 may also be useful.

The lateral switch 100 includes a free or floating drain magnet 120 that is coupled to the drain electrode 104. The floating drain magnet 120 has a magnetization vector $\hat{m}$ 122 that is oriented in an arbitrary direction. A channel 130 is disposed between the source magnet 110 and the drain magnet 120. In the depicted embodiment, the channel 130, the source magnet 110 and the drain magnet 120 are aligned and have coplanar surfaces. The lateral switch 100 includes a gate 140 coupled to the gate electrode 106, the gate being disposed above the drain magnet 120. In an embodiment, the gate 140 may be formed using multiferroic (MF) or, piezoelectric (PZ) material. The bottom surface of the gate 140 is coplanar with the top surface of the drain magnet 120. An angle θ 150 formed between the magnetization vector $\hat{M}$ 112 of the source magnet and magnetization vector $\hat{m}$ 122 of the drain magnet may be controlled by applying a finite voltage source $V_g$ 160 coupled to the gate electrode 106. The angle θ 150 is equal to 0° when the magnetization vector $\hat{M}$ 112 and magnetization vector $\hat{m}$ 122 are parallel, the angle θ 150 is equal to 90° when the magnetization vector $\hat{M}$ 112 and magnetization vector m̂ 122 are orthogonal and the angle θ 150 is equal to 180° when the magnetization vector M̂ 112 and magnetization vector m̂ 122 are anti-parallel. In an embodiment, $V_g$ 160 is configured to be greater than or equal to 0 volts.

Thus, by using ferromagnetic (or, magneto-elastic) to form the source, drain and gate magnets and multiferroic (or, piezoelectric) materials to form gate material of the lateral switch 100, magnetization of the drain magnet m̂ may be controlled by applying a voltage source $V_g$ 160 coupled to the gate electrode 106. Due to the coupled nature of the AFM and ferroelectric (FE) order parameters in MF material, by reversing FE polarization in it, a simultaneous change should occur in the AFM spins at the interface of layers 140 and 120 that allows further control of interfacial magnetic anisotropy energy (i-MAE) resulting in switching of the floating FM/ME layer.

In an embodiment, the source and drain 110 and 120 may be formed by using half-metallic ferromagnetic materials such as but not limited to $Co_2FeAl$, $La_{0.7}Sr_{0.3}MnO_3$ or any Heusler alloys or, by using magnetoelastic materials such as but not limited to Terfenol-D, Fe—Rh, etc. The gate 140 may be formed using multiferroic materials like $BiFeO_3$, $BiMnO_3$, $YMnO_3$, $Ni_3B_2O_{13}I$, h-$RMnO_3$, $Pb(Fe_{1/2}Ta_{1/2})O_3$, $Pb(Fe_{1/2}W_{1/2})O_3$, etc., or, piezoelectric materials like [Pb(Mg⅓Nb2/3)O3]$_{(1-x)}$-[PbTiO3]$_x$ (PMN-PT), Terfenol-D and similar others. The channel 130 may be formed using any non-magnetic (NM) material with high spin diffusion length/Spin Coherent channel such as but not limited to copper, graphene. Other suitable materials may also be employed for the source, drain, gate and channel of the lateral switch.

In an embodiment, free magnetic layer in a magnetic tunnel junction (MTJ) memory device may incorporate voltage-controlled switching techniques of the lateral switch 100, to perform non-volatile (NV) memory operations with virtually dissipationless information writing. Thus, in this embodiment, data may be written into drain magnet 120 using voltage controlled interfacial magnetic anisotropy used for ultra-low power dissipation since no spin current is associated with the "Write" operation into the drain magnet 120 in off or on state.

Figure 1D:
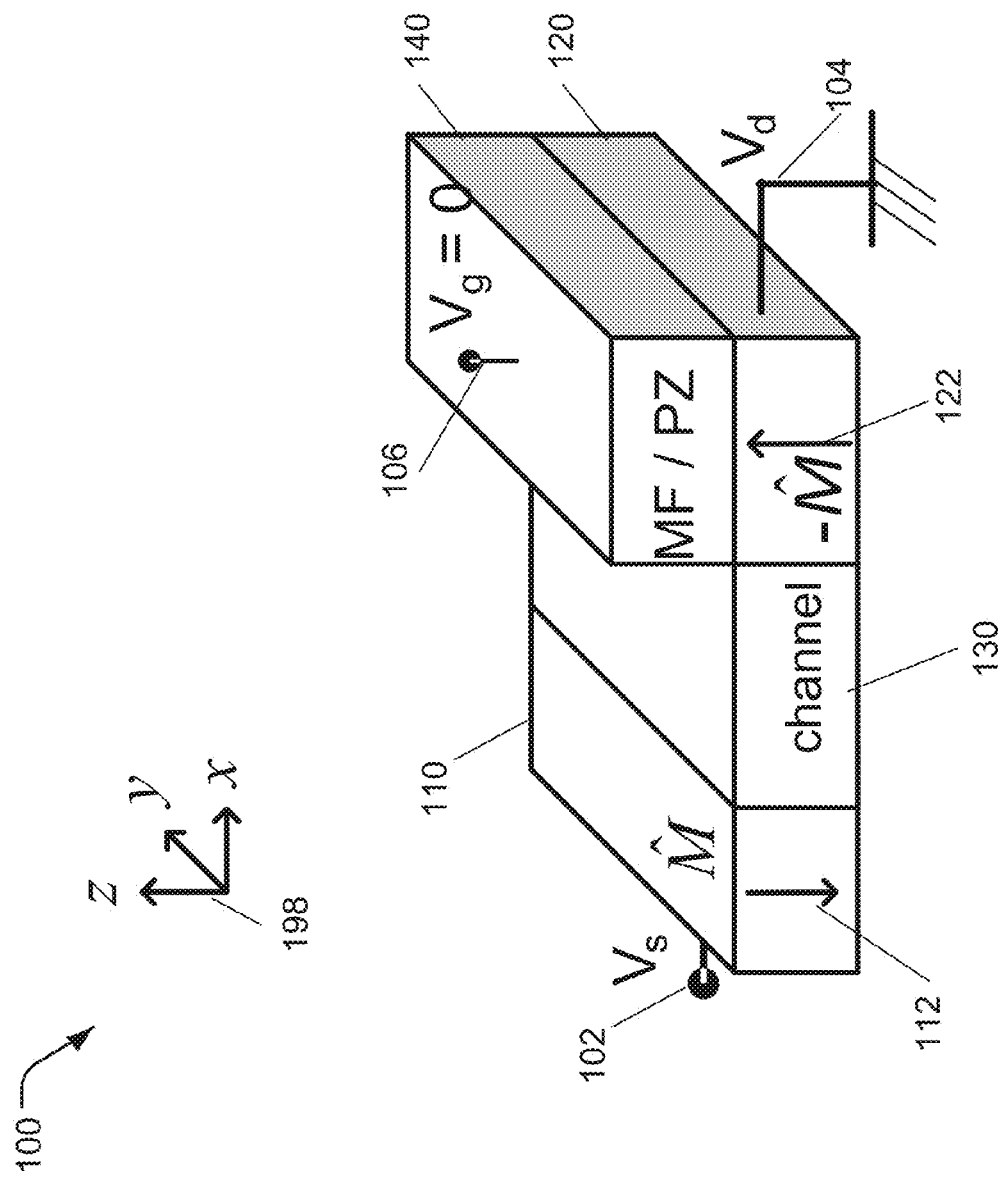
FIG. 1d shows a lateral switch, described with reference to FIG. 1c, operating in an off state.

In an embodiment, the lateral switch 100 is a binary switch that may be operated in an "OFF" state or an "ON" state by controlling the voltage source $V_g$ coupled to the gate electrode. FIG. 1d shows the lateral switch 100 operating in an "OFF" state in response to the voltage source $V_g$ being equal to 0 volts. Common elements and elements having the same reference numerals may not be described or described in detail. In the depicted embodiment, the drain electrode 104 is coupled to a reference voltage such as ground or 0 volts. In the "OFF" state, the magnetization vector M̂ 112 of the source magnet 110 and the magnetization vector m̂ 122 of the drain magnet 120 are aligned in an antiparallel direction due to magnetic dipolar interaction. Therefore, the angle θ 150 formed between M̂ 112 and magnetization vector m̂ 122 is equal to 180 degrees. In other words, in the "OFF" state, M̂·m̂=−1.

Figure 1E:
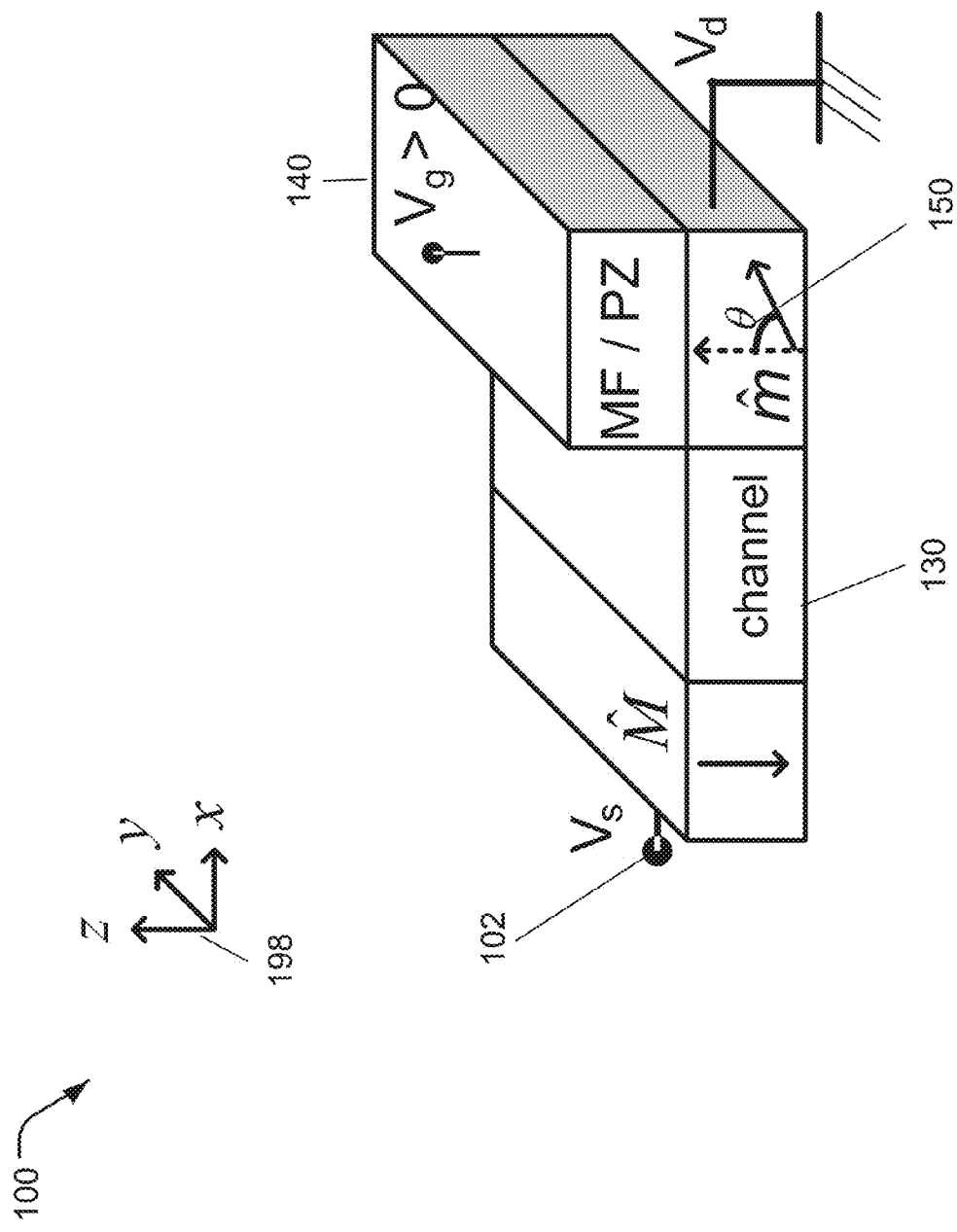
FIG. 1e shows a lateral switch, described with reference to FIG. 1c, operating in an on state.

FIG. 1e shows the lateral switch 100 operating in an "ON" state in response to the voltage source $V_g$ being greater than 0 volts. Common elements and elements having same reference numerals may not be described or described in detail. As described earlier with reference to FIG. 1c, due to the coupled antiferromagnetic (AFM) & ferroelectric (FE) effects of multiferroic (MF)/piezoelectric (PZ) material of the gate, an electrically modulated strain is generated at the MF/free FM (or, piezoelectric/magnetoelastic) interface of the drain electrode that may switch (a) the magnetization vector m̂ 122 of the drain magnet 120 from perpendicular (z) to in-plane (x or, -x) in case of MF/FM bilayer structure or, (b) the easy axis from perpendicular (z) to in-plane (x or, -x) in case of PZ/ME bilayer structure. Therefore, the angle θ 150 formed between the magnetization vector M̂ 112 and magnetization vector m̂ 122 becomes equal to 90 degrees. If $V_g$>>0, the electrically modulated strain may be sufficient to switch the magnetization vector m̂ 122 of the drain magnet 120 even to -z. In the "ON" state, −1<M̂·m̂≤1.

In order to switch the magnetization vector m̂ 122 of the drain magnet 120 to -z (M̂·m̂=1), a large $V_g$>>0 may be applied to overcome the magnetic coupling and switch it to -z direction. Note that the magnetic coupling ($H_{coupling}$) between source and drain magnets may depend on the channel length (L), (e.g., $H_{coupling}$~$1/L^3$). The channel length L may be configured to be large enough to reduce the effect of dipolar coupling. Since MF/FM (or, PZ/ME) interface is insulating, power dissipation during the switching process is negligible.

Referring to FIGS. 1c, 1d and 1e, the conductance $G_d$ of the lateral switch 100 is computed by Equation (1), $$G_d = 0.5G\left(1 - \rho^2 \frac{\tan^2 \theta/2}{\eta + \tan^2 \theta/2}\right) \quad \text{Equation (1)}$$

where G is conductance of FM/NM interface, p is the polarization and η is the ratio of spin mixing conductance and interface conductance. Assuming η→2 when p→1 (for half-metallic magnets), the conductance $G_d$ in the "OFF" state tends to be 0 according to the equation (1).

$$G_{d,AP}=0.5G(1-p^2)\rightarrow 0 \quad \text{Equation (2)}$$

In an embodiment, in the "ON" state, the value of the voltage source $V_g$ that is greater than 0 volts may be configured so that the angle θ 150 formed between the magnetization vector M̂ 112 and magnetization vector m̂ 122 is equal to 90 degrees so that M̂·m̂=0. In this embodiment, the conductance $G_d$ of the lateral switch 100 is computed according to the equation (1)

$$G_{d,\perp} = 0.5G(1 - p^2/\eta + 1) \rightarrow \frac{G}{3} \quad \text{Equation (3)}$$

In an embodiment, in the "ON" state, the value of the voltage source $V_g$ may be configured in a way that could drive 180 degree reversal of FM (or, ME) moment depending on the kinetics of the switching process. Therefore, the angle θ 150 formed between the magnetization vector M̂ 112 and magnetization vector m̂ 122 is equal to 0 degrees making them parallel (and M̂·m̂=1). In this embodiment, the conductance Gd of the lateral switch 100 is computed following Equation (1)

$$G_{d,P}=0.5G \quad \text{Equation (4)}$$

Distinguishing between "OFF" state (e.g., $V_g$=0) and "ON" state (e.g., $V_g$=a finite value) may be performed by measuring source-to-drain conductance(s). In "OFF" state $V_g$=0, $G_{sd}$=0 (M̂·m̂=−1) and in "ON" state $V_g$>0, $G_{sd}$=G/3 (M̂·m̂=0); $V_g$>>0, $G_{sd}$=G/2 (M̂·m̂=1). Therefore, the data stored in this embodiment may be written only by controlling $V_g$. Thus, the lateral switch 100 may be operable in three possible states corresponding to M̂·m̂=−1, 0 and 1 that may be identified by three different values of source-to-drain conductance $G_{sd}$=0, G/3 and G/2 respectively.

Figure 1F:
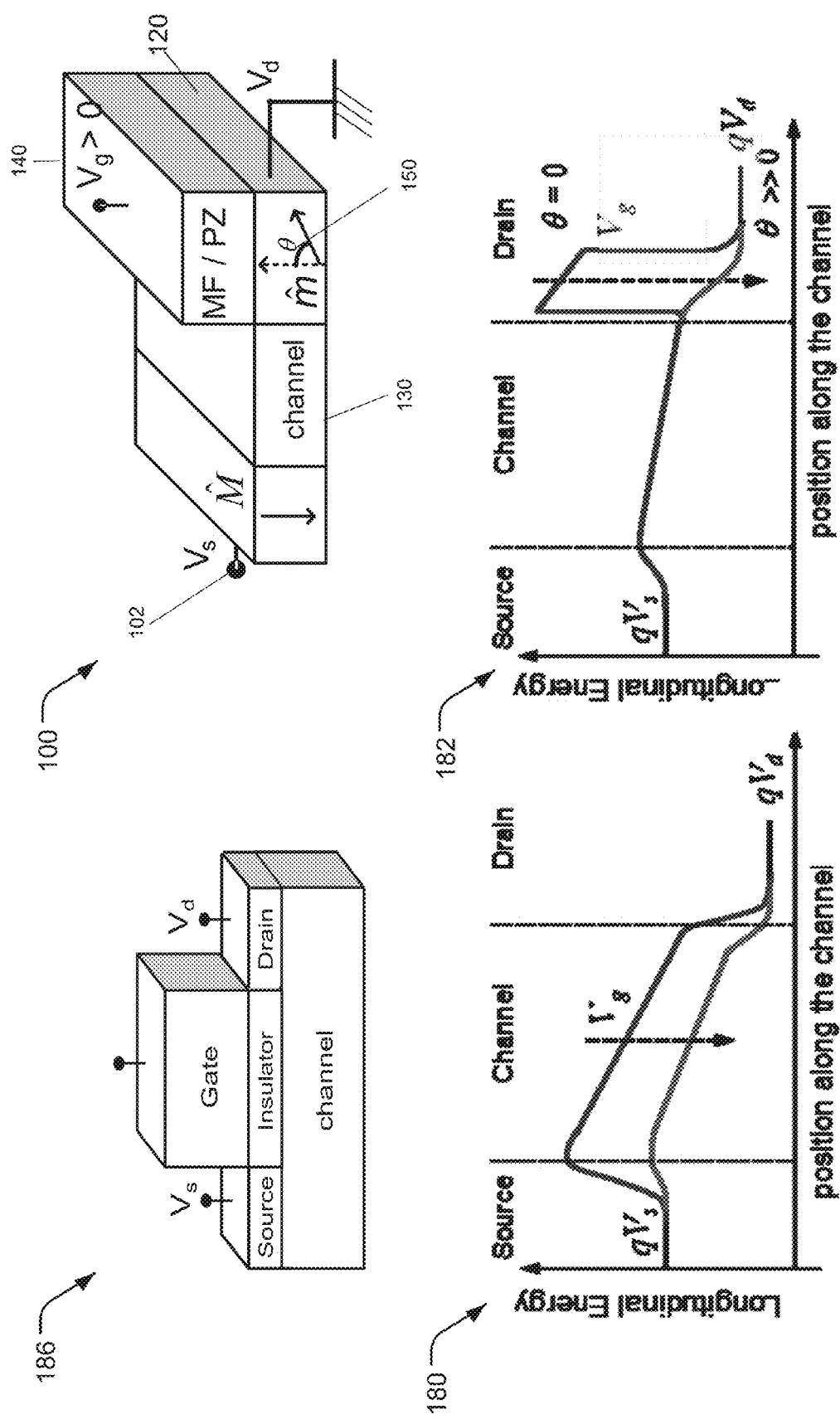
FIG. 1f shows graphical plots of longitudinal energy (Y-axis) as a function of position along the channel (X-axis) for a traditional CMOS switch and the proposed lateral spin switch, described with reference to FIG. 1c, respectively.

FIG. 1f shows graphical plots 180 and 182 of longitudinal energy (Y-axis) as a function of position along the channel (X-axis) for a traditional metal-insulator-semiconductor field effect transistor (MOSFET) device 186 and the lateral switch 100 respectively. In plots 180 and 182, the longitudinal energy required to traverse the channel from the source electrode to the drain electrode is decreased as magnitude of the voltage applied to the gate electrode $V_g$ is increased from 0 volts to a finite value. Likewise, in plot 182, the longitudinal (magnetic) energy barrier in the drain FM (or, ME) 120 of the lateral switch 100 is the highest in the "OFF" state, when $V_g$ is 0 volts and the angle θ 150 is 180 degrees (and magnetization vector $\hat{M}$ 112 and magnetization vector $\hat{m}$ 122 are anti-parallel). In the "ON" state, as the voltage $V_g$ is finite, the angle θ 150 is less than 180 degrees and the longitudinal energy barrier in the drain FM (or, ME) 120 is reduced due to change in the interface magnetic anisotropy energy (i-MAE) and the lateral switch 100 is switched on.

Figure 2A:
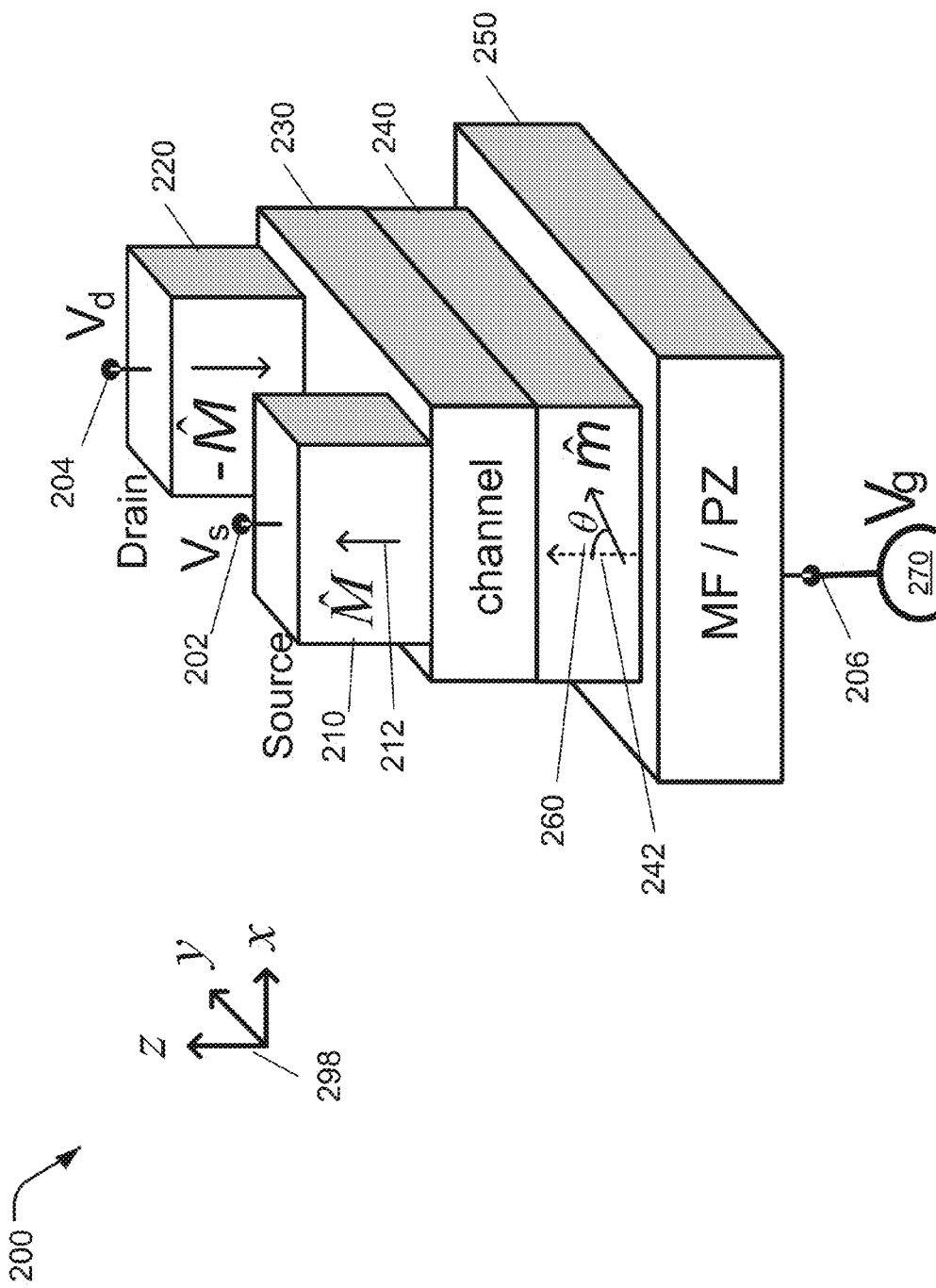
FIG. 2a shows an isometric view of an embodiment of a structure of a vertical spin switch with voltage controlled gate.

FIG. 2a shows an isometric view of an embodiment of a structure of a vertical spin switch 200 with voltage controlled multiferroic gate. In the depicted embodiment, the vertical spin switch 200 is configured to include at least three electrodes including source 202, drain 204, and gate 206 electrodes. A XYZ co-ordinate system 298 may be used as a reference to illustrate magnetization vector direction and 3D structural aspects of the vertical spin switch 200. The vertical spin switch 200 is also configured to include a source magnet 210 having a perpendicular magnetization vector $\hat{M}$ 212 (e.g., aligned along Z axis) coupled to the source electrode, a drain magnet 220 having a perpendicular magnetization vector $-\hat{M}$ (e.g., aligned along $-Z$ axis) coupled to the drain electrode, and a channel layer 230 disposed between the source magnet 210 and the drain magnet 220. The bottom surfaces of the drain magnet 220 and the source magnet 210 are coplanar with a top surface of the channel layer 230. Other suitable orientations of the magnetization vector $\hat{M}$ 212 may also be useful.

The vertical spin switch 200 is also configured to include a free or floating gate FM (or, ME) layer 240 having a magnetization vector $\hat{m}$ 242 oriented in an arbitrary direction, the magnetic layer 240 being disposed below the channel layer 230 and the electric field controlled multiferroic (MF) layer 250 disposed below the floating gate magnet layer 240. The MF layer 250 is coupled to the gate electrode 206. By using the concept of the multiferroic control of magnetism, an angle θ 260 formed between the magnetization vector $\hat{M}$ 212 and magnetization vector $\hat{m}$ 242 that may be controlled by applying a finite voltage $V_g$ 270 coupled to the gate electrode 206. An initial magnetization of the gate FM (or ME) layer 240 is out-of-plane (e.g., aligned with ±Z). Since the exchange coupled source and drain magnets are having magnetizations along $\hat{M}$ and $-\hat{M}$, there is no difference in the initial configuration of floating gate magnetization $\hat{m}$ (+Z or, −Z) with respect to the exchange coupled layers.

FIG. 2b shows an isometric view of an embodiment of a structure of a vertical spin switch 200 described with reference to FIG. 2a operating in an "OFF" state. Common elements and elements having the same reference numerals may not be described or described in detail. $V_{th}$ is a voltage above which the magnetization vector $\hat{m}$ 242 of the floating gate magnet layer 240 switches from perpendicular (±z) to in-plane (±x) direction so that the angle θ 260 becomes 90 degrees. The switch may occur at any voltage >V/2, where V is the source-to-drain voltage. In the "OFF" state, $V_g \leq V_{th}$ and magnetization vector $\hat{m}$ 242 is along "±Z" and source-to-drain conductance $G_{sd}$ is "0" if the magnets are half-metallic in nature. In the "OFF" state, it may be desirable to have zero current from gate electrode to the channel and to achieve this, we configure $V_g = p^2/(3-p^2)*V$ where V is the source-to-drain voltage and $\hat{M} \cdot \hat{m} = -1$. Also at "OFF" state, $G_{sd}$ may be configured to be equal to zero (with p=1)→thus "OFF" state $V_g = V/2 \leq V_{th}$.

Figure 2C:
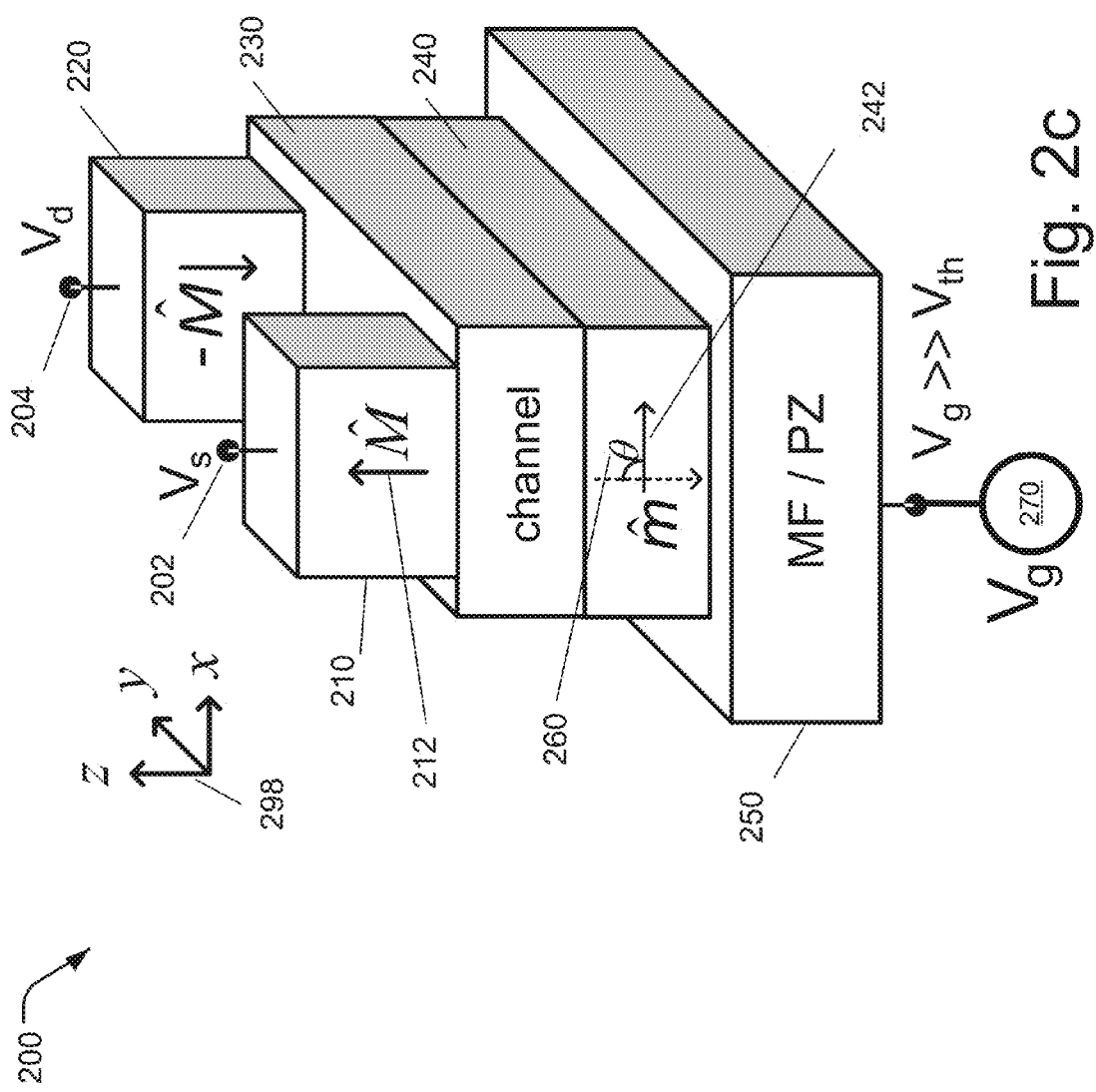
FIG. 2c shows an isometric view of an embodiment of a structure of a vertical spin switch, described with reference to FIG. 2a, operating in an on state.

FIG. 2c shows an isometric view of an embodiment of a structure of a vertical spin switch 200 described with reference to FIG. 2a operating in an "ON" state. Common elements and elements having the same reference numerals may not be described or described in detail. When $V_g > V_{th}$, gate exerts an electrically modulated strain that may change the interfacial magnetic anisotropy of the MF/FM (or, ME) interface and turns the magnetization vector $\hat{m}$ 242 from ±z to ±x direction, $\hat{M} \cdot \hat{m} = 0$ and $G_{sd}$ has a finite value that may be computed using Equation (2)

$$G_{sd} = \left(1 - \frac{2P^2}{2+\eta}\right)\frac{G}{2} \rightarrow \frac{G}{4}. \qquad \text{Equation (5)}$$

where G is the base conductance of all FM/NM interface(s), $P_1 = P_g = P_2$ (=P) are the polarizations for all of the interfaces and is the spin mixing conductance. We also assume η→2 when P→1 (for half-metallic ferromagnets). The value of the voltage source $V_g$ may be configured in a way that could drive 180 degree reversal of FM (or, ME) moment depending on the kinetics of the switching process leading to a situation similar to $V_g \leq V_{th}$. Spin current flows from source electrode 202 to drain electrode 204 along X direction. No current from the electric field controlled multiferroic (MF)/piezoelectric (PZ) layer 250 to the FM/ME layer as MF/FM (or, PZ/ME) interface is insulating. Therefore, highest source-to-drain conductance and maximum current occurs when $\hat{M} \cdot \hat{m} = 0$.

Figure 3A:
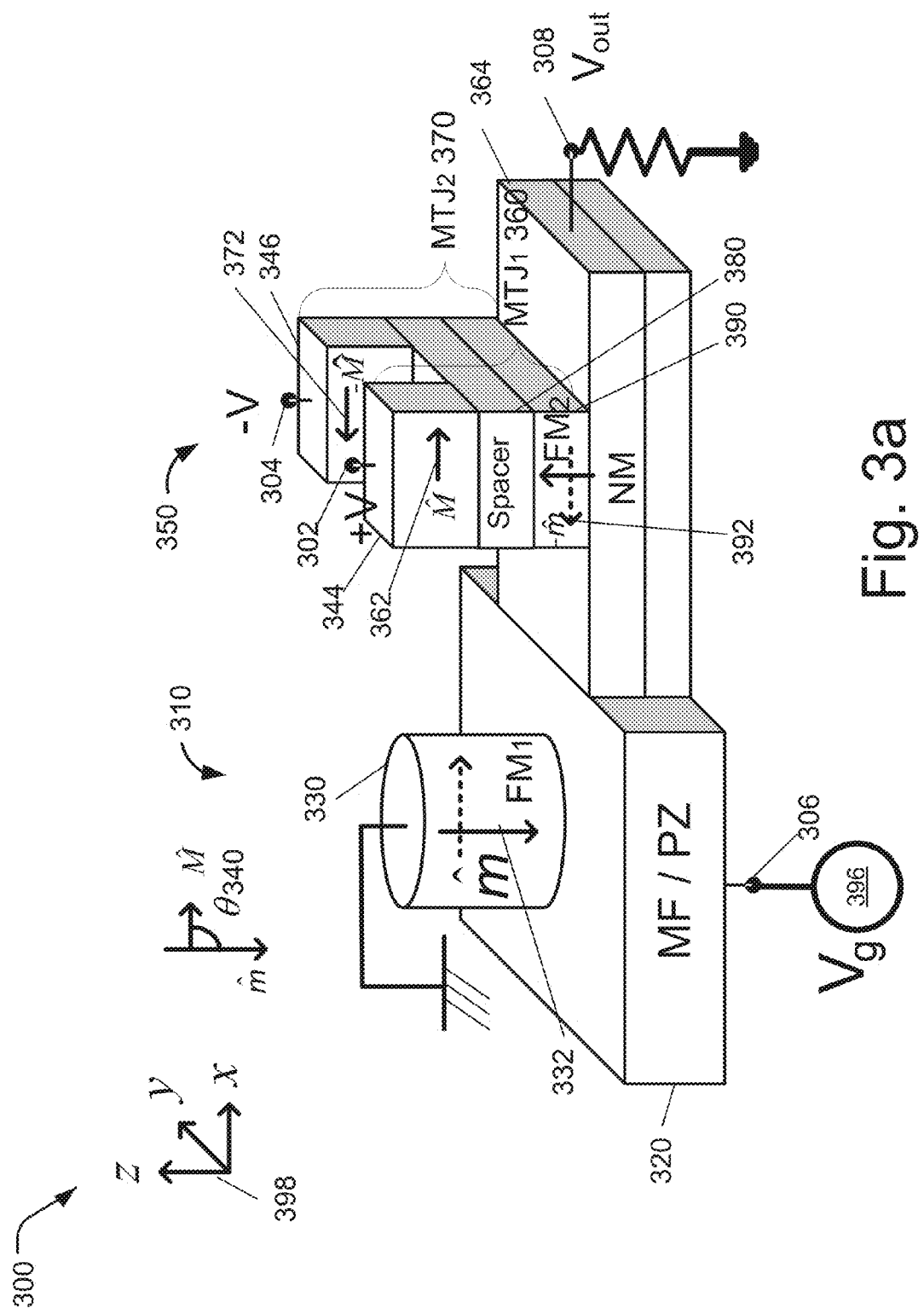
FIG. 3a shows an isometric view of an embodiment of a structure of a lateral spin switch with voltage controlled magnetic gate.

FIG. 3a shows an isometric view of an embodiment of a structure of a lateral spin switch 300 with voltage controlled magnetic gate. In the depicted embodiment, the lateral spin switch 300 is configured to include at least four electrodes including source 302, drain 304, gate 306 electrodes and an output electrode 308. The lateral spin switch 100 with voltage controlled magnetic drain described with reference to FIGS. 1c, 1d and 1e and the vertical spin switch 200 with voltage controlled gate described with reference to FIGS. 2a, 2b and 2c may be configured as individual spin switch devices for standalone operation. An open circuit voltage output $V_{out}$ measured across a resistor connected between the output electrode 308 and a ground reference may be used as the input voltage for the next stage of operation, thereby propagating spin information from one spin switch device to another spin switch device.

Figure 3B:
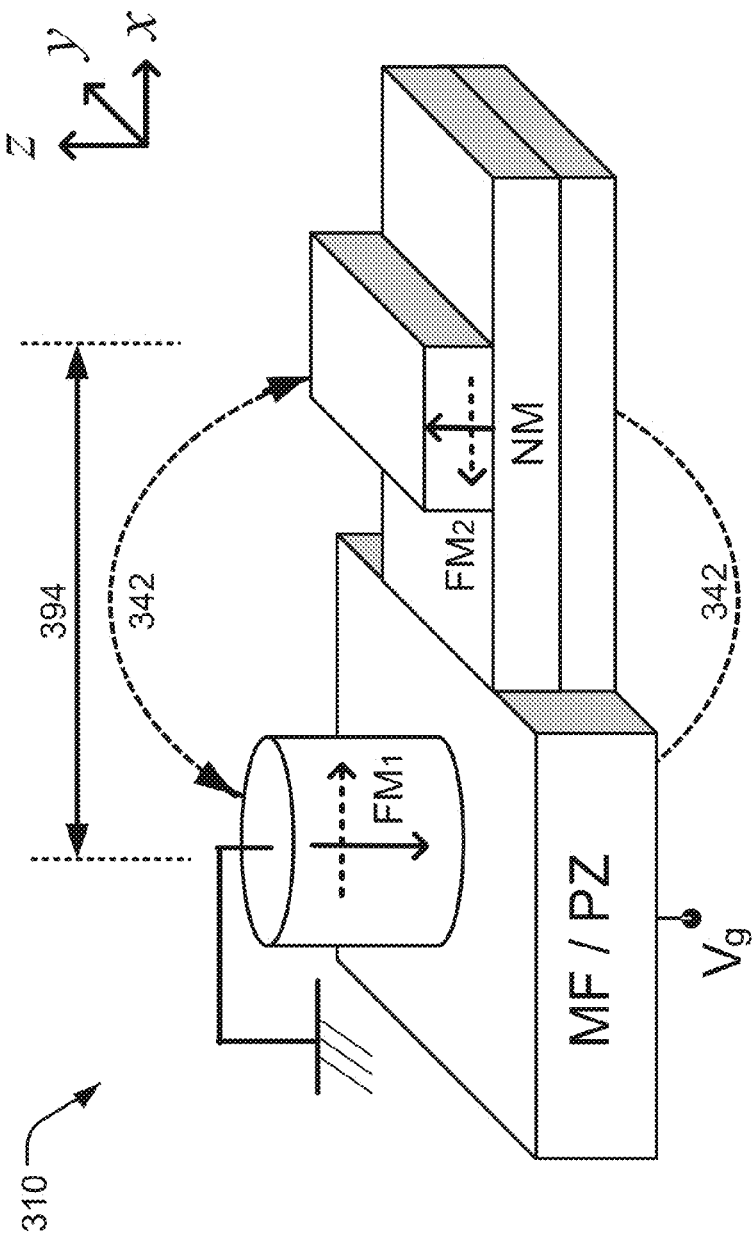
Figure 3C:
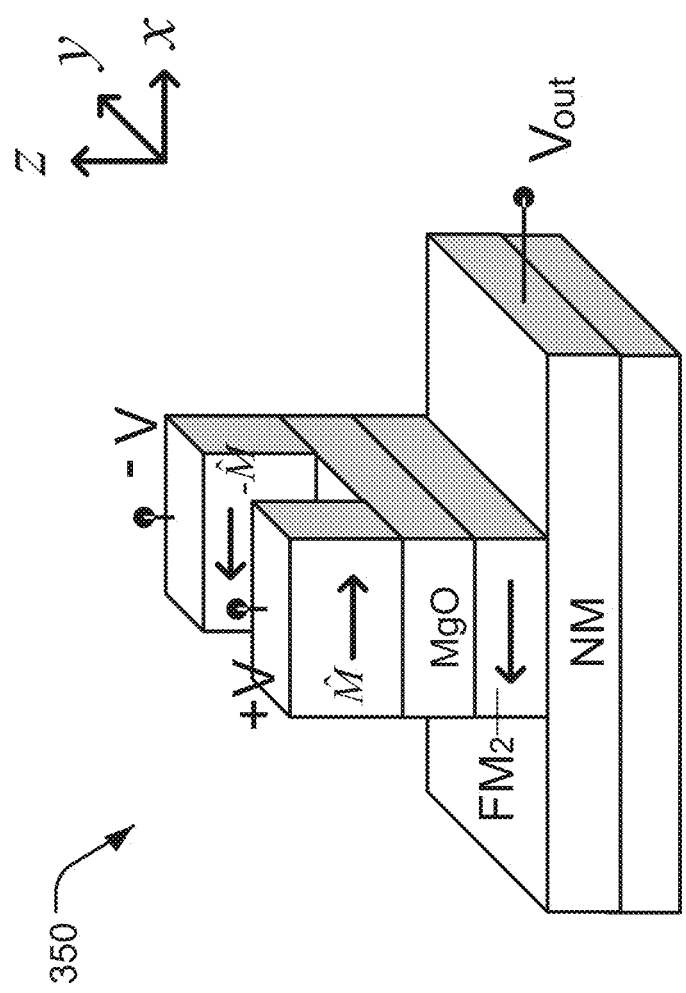

A XYZ co-ordinate system 398 may be used as a reference to illustrate magnetization vector direction and 3D structural aspects of the lateral spin switch 300. In the depicted embodiment, the lateral spin switch 300 is further configured to include a "Write" unit 310 and a "Read" unit 350. FIG. 3b shows an isometric view of an embodiment of a structure of a "Write" unit 310. FIG. 3c shows an isometric view of an embodiment of a structure of a "Read" unit 350. Common elements and elements having the same reference numerals may not be described or described in detail.

Referring to FIGS. 3a, 3b and 3c, the "Write" unit 310 is configured to include a voltage controlled multiferroic (MF) material layer or, a piezoelectric (PZ) layer 320 coupled to the gate electrode 306 and a first floating ferromagnetic layer (FM$_1$) 330 having a magnetization vector $\hat{m}$ 332. The FM$_1$ layer 330 is disposed on top of and perpendicular to the voltage controlled multiferroic (MF) or, piezoelectric (PZ) material layer 320. In an embodiment, multiferroic (MF) materials may include BiFeO$_3$, BiMnO$_3$, YMnO$_3$, Pb(Fe$_{1/2}$Ta$_{1/2}$)O$_3$, Pb(Fe$_{1/2}$W$_{1/2}$)O$_3$, or, piezoelectric materials like [Pb(Mg⅓Nb2/3)O3]$_{(1-x)}$-[PbTiO3]$_x$ (PMN-PT) and similar others. Ferromagetic (FM) materials may include Fe, Co, Ni, CoFeB, NiFe, Co$_2$FeAl, LSMO, FePd, FePt or, any FM material or, alloys. Magnetoelastic materials may include Terfenol-D and similar others. Spacer material may include insulator such as MgO, Al$_2$O$_3$, HfO$_2$, ZrO$_2$, SrTiO$_3$, Gd$_2$O$_3$ and similar complex oxides. Non-magnetic metal (NM) layer 364 may include (Cu, Ta, Ru, Mo, BN, Si, Graphene) or Spin Coherent channel material. Other suitable materials may also be employed.

The "Read" unit 350 includes two exchange-coupled reference ferromagnetic layers with a first FM 344 having a magnetization vector $\hat{M}$ 362 and a second FM 346 having a magnetization vector $-\hat{M}$ 372. The first FM and the second FM have a common insulator or, spacer layer 380 and a common second floating ferromagnetic layer (FM$_2$) 390 having a magnetization vector $-\hat{m}$ 392, thereby constituting two MTJ layers (MTJ$_1$ 360 and MTJ$_2$ 370). The FM$_1$ and FM$_2$ layers 330 and 390 are separated by a configurable distance 394 to enable magnetic dipolar coupling. The magnetization vector $\hat{m}$ of FM$_1$ 332 is controlled by a voltage source V$_g$ 396 coupled to the gate electrode 306 that in turn changes the magnetization orientation $-\hat{m}$ of FM$_2$. The angle θ 340 formed between $\hat{M}$ and $-\hat{m}$ is equal to 0° when the magnetization vector $\hat{M}$ 362 and magnetization vector $\hat{m}$ 392 are parallel and the angle θ 340 is equal to 180° when the magnetization vector $\hat{M}$ 362 and magnetization vector $\hat{m}$ 392 are anti-parallel. Other suitable orientations of the magnetization vector $\hat{M}$ 362 and $-\hat{M}$ 372 may also be useful.

In an embodiment, a lateral spin switch based on magnetic tunnel junctions may include magnetic tunnel junction (MTJ) structure having one layer with a fixed or reference magnet $\hat{M}$ separated by a tunneling barrier or spacer layer from a free magnet of nanometer scale thickness whose magnetization $\hat{m}$ (or $-\hat{m}$) represents the stored information. The "Write" unit 350 is operable to convert the input current into the magnetization $\hat{m}$ (or $-\hat{m}$) of the free magnet, while the "Read" unit 310 converts the information stored in $\hat{m}$ (or $-\hat{m}$) into an output current Iout (e.g., V$_{out}$/R).

On application of gate voltage V$_g$ 396 at the gate electrode 306, the direction of magnetization $\hat{m}$ 332 or, state of magnetization of FM$_1$ is switched from its original perpendicular magnetization to in-plane magnetization, depending on change in interfacial magnetic anisotropy for MF/FM interface or, change in magnetic easy axis for PZ/ME interface. FM$_1$ 330 can deterministically drive FM$_2$ 390 due to magnetic dipolar coupling 342, based on its own polarization. FM$_1$ 330 may have a higher volume (V) and saturation magnetization (M$_s$) compared to FM$_2$ 390. The "Write" unit 350 includes the exchange coupled reference FM(s) on the top of FM$_2$, separated by an insulating layer, thereby constituting individual MTJs (e.g. MTJ$_1$ 360, MTJ$_2$ 370) whose conductance may be determined by the relative magnetization of FM$_2$ relative to the reference layers $\hat{M}$ 362 and $-\hat{M}$ 372.

In the depicted embodiment, the MTJ$_1$ 360 and MTJ$_2$ 370 structures are disposed on top of and perpendicular to a non-magnetic metal (NM) channel layer 364 to form a FM/NM interface. Ballistic transport may be desirable in the NM channel layer 364.

Thus, the lateral spin switch 300 is a non-volatile spin switch device with two reference ferromagnetic (FM) layers having magnetization vectors $\hat{M}$ 362 and $-\hat{M}$ 372 oriented in configurable directions, and two dipole-coupled floating FM layers (FM$_1$ 330 and FM$_2$ 390) having magnetization vectors $\hat{m}$ 332 and $-\hat{m}$ 392 configured to be in any arbitrary direction, acting as a measuring electrode. The magnetic dipolar coupling 342 provides electrical isolation for the lateral spin switch device 300 that has a "Read"-"Write" unit. The magnetization vector $\hat{m}$ of FM$_1$ may be controlled by applying a finite voltage to the multiferroic (MF) layer 320, which in turn switches the FM$_2$ 390 magnetization. In the depicted embodiment, FM$_1$ 330 and FM$_2$ 390 may be initially perpendicularly polarized (e.g., in +/−Z direction), while reference magnets are polarized in-plane (e.g., in +/−X direction).

Depending on the orientation of magnetic vector $\hat{m}$, one MTJ will be in low resistance (P—Parallel) state, while the other MTJ will be in high resistance (AP—Anti-Parallel) state. The equivalent read circuit leads to Equations (6) and (7) for computing open circuit voltage V$_{out}$ and current I$_c$ respectively:

$$V_{out} = -P_M P_m (\hat{M} \cdot \hat{m}) V \qquad \text{Equation (6)}$$

where P$_M$: spin polarization of reference magnet ($\hat{M}$)/MgO interface, P$_m$: spin polarization of FM$_2$ ($-\hat{m}$)/MgO interface, G=G$_P$+G$_{AP}$, GP: Parallel (P) conductance of a single MTJ, G$_{AP}$: Anti-Parallel (AP) conductance of a single MTJ.

$$I_c = \frac{V_{out}}{R + 1/G} \qquad \text{Equation (7)}$$

In a first operating state of the lateral spin switch 300 that is controlled by V$_g$, V$_g$=0 volts and FM$_1$ along +z and FM$_2$ along −z. Since $\hat{M} \cdot \hat{m}$=0, V$_{out}$=0 and I$_c$=0. In a second operating state of the lateral spin switch 300, V$_g$ is >>0, FM$_1$ is along +x and FM$_2$ is along −x. Since $\hat{M} \cdot \hat{m}$=+/−1, V$_{out}$, I$_c$ and gain may be computed based on Equations (6) and (7) as: V$_{out}$=P$_M$*P$_m$*V, I$_c$=[G*P$_M$*P$_m$*V]/[1+RG], gain=P$_M$*P$_m$*[V/V$_g$].

Figure 3D:
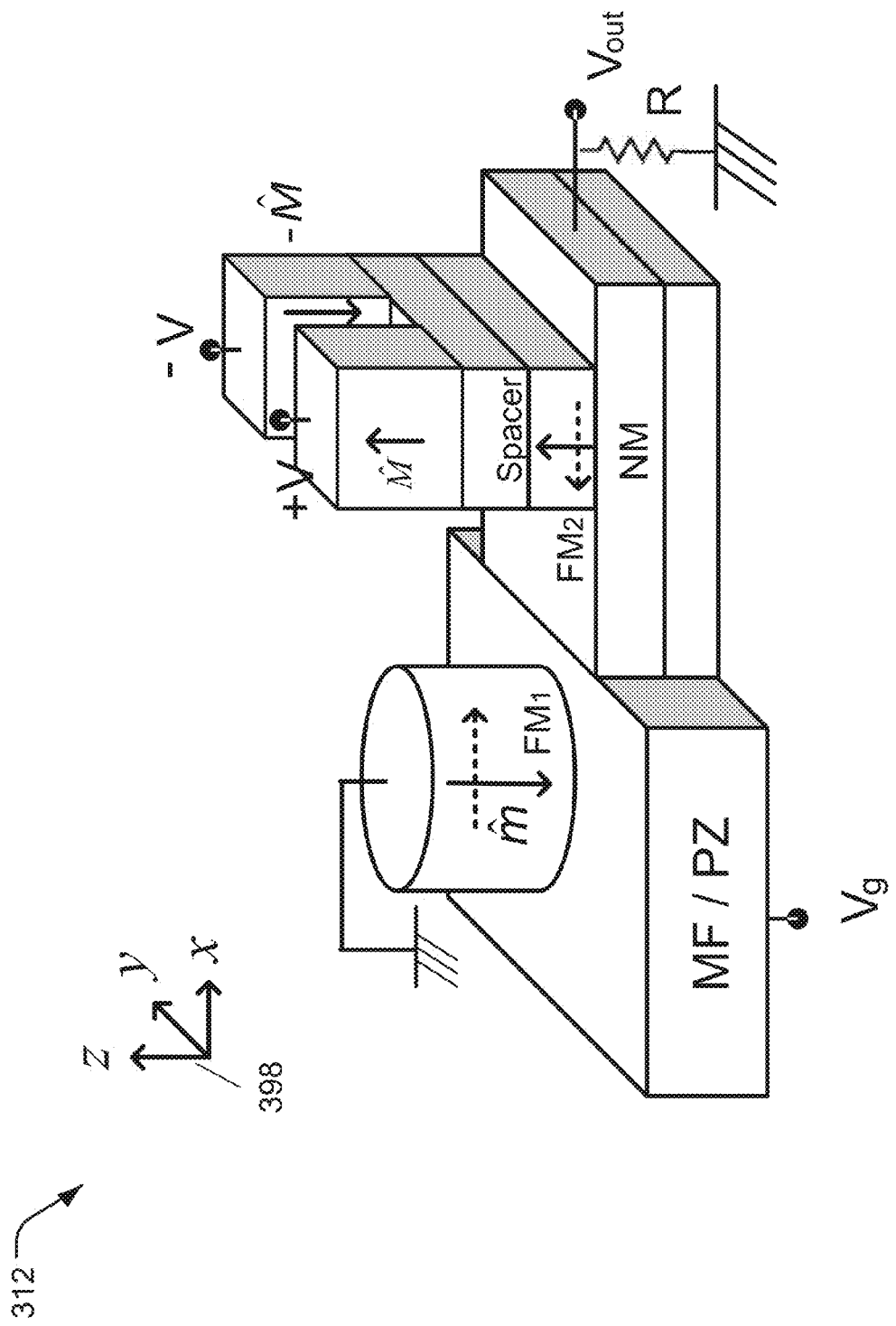
FIG. 3d shows an isometric view of an embodiment of a structure of a voltage controlled complementary spin switch.

FIG. 3d shows an isometric view of an embodiment of a structure of a voltage controlled complementary spin switch 312. The structure of the voltage controlled complementary spin switch 312 is substantially similar to the lateral spin switch 300 described with reference to FIGS. 3a, 3b and 3c except for the orientation of the magnetization vectors $\hat{M}$ and $-\hat{M}$ in the first and second fixed magnets of the MTJ$_1$ 360 and MTJ$_2$ 370 structures. In the depicted embodiment, the magnetization vectors $\hat{M}$ and $-\hat{M}$ are oriented in +/−Z direction. Common elements and elements having same reference numerals may not be described or described in detail.

In a first operating state of the complementary spin switch 312 that is controlled by V$_g$, V$_g$=0 volts and FM$_1$ along −Z and FM$_2$ along +Z. Since $\hat{M} \cdot \hat{m}$=+/−1, V$_{out}$, I$_c$ and gain may be computed based on Equations (6) and (7) as V$_{out}$=P$_M$*P$_m$*V, I$_c$=+/−[G*P$_M$*P$_m$*V]/[1+RG], gain=infinity (or, a very high value) since V$_g$ is 0 volts. In a second operating state of the spin switch 312, V$_g$ is >>0, FM$_1$ is along +X and FM$_2$ is along −X (due to magnetic coupling). Since $\hat{M} \cdot \hat{m}$=0, V$_{out}$=0 and I$_c$=0.

The embodiments as described above result in advantages. Voltage controlled switching of magnetic state variable (drain magnet) involves virtually dissipationless information writing. Magnetic spin switches are provided with direct control of drain or gate in electron spins via electric field induced magnetic anisotropy tuned with finite $V_g$. This may be equivalent to direct control of the channel electrons via electric field induced with $V_g$ in conventional Metal-Oxide-Semiconductor (MOS) transistors. The spin switches provide diminishing off state source-to-drain current with half-metallic FM. Therefore, on-to-off current ratio approaches infinity (or a very high value). A voltage controlled complementary switch is provided with a voltage gain that approaches infinity (or a very high value). Ultra-low power spin transistor or switch is provided that provides high on-to-off current ratios and dissipationless writing. Magnetic spin switches are compatible with the Magnetoelastic (ME) Magnetic Tunnel Junction (MTJ) devices and may be implemented using current MRAM technology.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A switch comprising:
   at least three electrodes including source, drain, and gate electrodes;
   a source magnet having a magnetization vector $\hat{M}$, the source magnet being coupled to the source electrode;
   a drain magnet having a magnetization vector $\hat{m}$, the drain magnet being coupled to the drain electrode;
   a channel disposed between the source magnet and the drain magnet; and
   a gate disposed above the drain magnet, the gate being coupled to the gate electrode, wherein an angle formed between the magnetization vector $\hat{M}$ and the magnetization vector $\hat{m}$ is controlled by a voltage source $V_g$ coupled to the gate electrode, wherein the gate comprises a MF/PZ layer formed by one of multiferroic (MF) and a piezoelectric (PZ) material.

2. The switch of claim 1, wherein the magnetization vector $\hat{M}$ and the magnetization vector $\hat{m}$ have an anti-parallel direction in response to the voltage source $V_g$ being equal to 0 volts, wherein the drain electrode is coupled to a ground reference, wherein the 0 volts corresponds to an OFF state.

3. The switch of claim 1, wherein the angle is approximately between 0 degrees and less than 180 degrees in response to the voltage source $V_g$ being greater than 0 volts corresponding to an ON state.

4. The switch of claim 1, wherein the gate wherein the MF/PZ layer exerts an electrically modulated magnetic anitropy in response to the voltage source $V_g$ being greater than 0 volts, wherein the electric field controlled change in interface magnetic anisotropy causes a change in magnetization of Ferromagnet (FM) or Magnetoelastic (ME) layer.

5. The switch of claim 1, wherein a value of conductance $G_{d,AP}$ measured between the source electrode and the drain electrode is approximately equal to 0 mho in response to the voltage source $V_g$ being equal to 0 volts and the drain electrode being coupled to a ground reference.

6. The switch of claim 1, wherein a value of conductance $G_{d,PD}$ measured between the source electrode and the drain electrode is approximately $\frac{1}{3}^{rd}$ of a conductance G in response to the angle being approximately equal to 90 degrees, wherein the conductance G is measured across the interface between the channel and the drain magnet.

7. The switch of claim 1, wherein a value of conductance $G_{d,P4}$ measured between the source electrode and the drain electrode is approximately $\frac{1}{2}$ of a conductance G in response to the angle being approximately equal to 0 degrees, wherein the conductance G is measured across the interface between the channel and the drain magnet.

8. The switch of claim 1, wherein a binary operating state of the switch is controlled by adjusting a value of the voltage source $V_g$.

9. The switch of claim 1, wherein the source magnet and the drain magnet is configured as a half-metallic ferromagnet, wherein the gate is disposed directly on top of the drain magnet.

10. The switch of claim 2, wherein a multiplication of the magnetization vector $\hat{M}$ and the magnetization vector $\hat{m}$ is equal to −1 in the OFF state.

11. The switch of claim 3, wherein a multiplication of the magnetization vector $\hat{M}$ and the magnetization vector $\hat{m}$ is equal to 0 in response to the angle being approximately equal to 90 degrees in the ON state.

12. The switch of claim 3, wherein the multiplication is equal to 1 in response to the angle being equal to 0 degrees in the ON state.

13. A switch comprising:
   at least three electrodes including source, drain, and gate electrodes;
   a source magnet having an out-of-plane magnetization vector $\hat{M}$, the source magnet being coupled to the source electrode;
   a drain magnet having an out-of-plane magnetization vector $-\hat{M}$, the drain magnet being coupled to the drain electrode;
   a channel layer disposed between the source magnet and the drain magnet, wherein bottom surfaces of the drain magnet and the source magnet are coplanar with a top surface of the channel layer;
   a floating gate magnet which comprises a Ferromagnet (FM) or, Magnetoelastic (ME) layer having a magnetization vector $\hat{m}$, the floating gate magnet layer being disposed below the channel layer; and
   a multiferroic (MF) or, a Piezoelectric (PZ) layer disposed below the floating gate magnet layer, the MF or, the PZ layer being coupled to the gate electrode, where the magnetization vector $\hat{m}$ of the floating gate magnet is directly controlled by a voltage source $V_g$ coupled to the gate electrode.

14. The switch of claim 13, wherein the magnetization vector $\hat{M}$ and the magnetization vector $\hat{m}$ have an anti-parallel direction in response to the voltage source $V_g$ being less than or equal to a threshold voltage $V_{th}$, wherein the 0 volts corresponds to an OFF state.

15. The switch of claim 13, wherein the magnetization vector $\hat{M}$ and the magnetization vector $\hat{m}$ are perpendicular to each other in response to the voltage source $V_g$ exceeding a threshold voltage $V_{th}$, wherein the angle being equal to 90 degrees corresponds to an ON state.

16. The switch of claim 14, wherein a multiplication of the magnetization vector $\hat{M}$ and the magnetization vector $\hat{m}$ is equal to −1 in the OFF state.

17. The switch of claim 14, wherein the MF/PZ layer exerts an electrically modulated strain in response to the voltage source $V_g$ being greater than the threshold voltage $V_{th}$, wherein the electrically modulated strain causes a change in the interfacial magnetic anisotropy of the FM or, the ME layer, thereby changing the state or, the direction of magnetism of the FM or, the ME layer depending on the choice between the PZ/ME and the MF/MF interface respectively.

18. The switch of claim 14, wherein a source-to-drain conductance $G_{sd}$ is approximately equal to 0 mhos in the OFF state.

19. The switch of claim 15, wherein the MF/PZ layer exerts an electrically modulated strain in response to the voltage source $V_g$ being greater than the threshold voltage $V_{th}$, wherein the electrically modulated strain causes the angle to be equal to 90 degrees.

20. A switch comprising:
a write unit including a E-field controlled MF/PZ layer formed by using one of multiferroic (MF) and piezoelectric (PZ) material, the MF/PZ layer coupled to a gate electrode and a first floating ferromagnetic layer ($FM_1$) having a magnetization vector $\hat{m}$, wherein the $FM_1$ layer is disposed on top of the MF/PZ layer; and
a read unit including an exchange coupled ferromagnetic layers including the first FM having a magnetization vector $\hat{M}$ and the second FM having a magnetization vector $-\hat{M}$, wherein the first FM and the second FM have a common insulator layer and a common second floating ferromagnetic layer ($FM_2$) having a magnetization vector $-\hat{m}$, wherein the $FM_1$ and $FM_2$ layers are separated by a configurable distance to enable magnetic dipolar coupling,
wherein the magnetization vector $\hat{m}$ is controlled by a voltage source $V_g$ coupled to the gate electrode, wherein an angle formed between the magnetization vector $\hat{M}$ and the magnetization vector $-\hat{m}$ is driven by the magnetization vector m due to the magnetic dipolar coupling.

21. The switch of claim 20 wherein the $FM_2$ layer being disposed on top of a non-metallic (NM) layer, the NM layer being coupled to an output electrode.

22. The switch of claim 20, wherein a direction of the magnetization vector $\hat{M}$ is configured to be in-plane, wherein the angle is equal to 90 degrees in response to the voltage source $V_g$ being equal to 0 volts, wherein voltage at the output electrode is 0 volts in response to the voltage source $V_g$ being equal to 0 volts.

23. The switch of claim 20, wherein a direction of the magnetization vector $\hat{M}$ is configured to be out-of-plane, wherein the angle is equal to 90 degrees in response to the voltage source $V_g$ being greater than 0 volts, wherein voltage at the output electrode is 0 volts in response to the voltage source $V_g$ being greater than 0 volts.

24. The switch of claim 20, wherein a direction of the magnetization vector $\hat{M}$ is configured to be out-of-plane, wherein the angle is equal to 0 degrees in response to the voltage source $V_g$ being equal to 0 volts, wherein voltage at the output electrode is very large in response to the voltage source $V_g$ being equal to 0 volts.

* * * * *